(12) United States Patent
Furukawa et al.

(10) Patent No.: US 10,892,352 B2
(45) Date of Patent: Jan. 12, 2021

(54) POWER SEMICONDUCTOR DEVICE

(71) Applicant: MITSUBISHI ELECTRIC CORPORATION, Chiyoda-ku (JP)

(72) Inventors: Akihiko Furukawa, Chiyoda-ku (JP); Shoichi Orita, Chiyoda-ku (JP); Hiroki Muraoka, Chiyoda-ku (JP); Atsushi Narazaki, Chiyoda-ku (JP); Tsuyoshi Kawakami, Chiyoda-ku (JP); Yuji Murakami, Chiyoda-ku (JP)

(73) Assignee: MITSUBISHI ELECTRIC CORPORATION, Chiyoda-ku (JP)

(*) Notice: Subject to any disclaimer, the term of this patent is extended or adjusted under 35 U.S.C. 154(b) by 15 days.

(21) Appl. No.: 16/212,051

(22) Filed: Dec. 6, 2018

(65) Prior Publication Data
US 2019/0109220 A1 Apr. 11, 2019

Related U.S. Application Data

(62) Division of application No. 15/122,261, filed as application No. PCT/JP2014/078815 on Oct. 29, 2014, now Pat. No. 10,192,977.

(30) Foreign Application Priority Data

Apr. 21, 2014 (JP) ................................ 2014-087462

(51) Int. Cl.
*H01L 29/739* (2006.01)
*H01L 29/40* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
None
See application file for complete search history.

(56) References Cited

U.S. PATENT DOCUMENTS 6,153,896 A 11/2000 Omura et al.
6,534,998 B1 3/2003 Omura et al.
(Continued)

FOREIGN PATENT DOCUMENTS

JP 10-321856 A 12/1998
JP 2002-16252 A 1/2002
(Continued)

OTHER PUBLICATIONS

International Search Report dated Dec. 16. 2014 in PCT/JP2014/078815 filed Oct. 29, 2015.
(Continued)

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

In the present application, a power semiconductor device includes a first-conductive-type first base region having a first principal surface and a second principal surface opposite to the first principal surface, a second-conductive-type second base region disposed on the first principal surface and at least three groove parts parallel to each other disposed from a surface of the second base region. The device further includes insulating films covering inner walls of the respective groove parts, conductive trench gates filled on the insulating films, a first-conductive-type emitter region disposed in the second base region, and a second-conductive-type collector region disposed on the second principal surface of the first base region. The trench gates embedded in the first groove part and the third groove part are elec-
(Continued)

trically connected to the gate electrode, and the trench gate embedded in the second groove part is electrically connected to the emitter electrode.

10 Claims, 10 Drawing Sheets

(51) Int. Cl.
*H01L 29/06* (2006.01)
*H01L 29/08* (2006.01)
*H01L 29/10* (2006.01)
*H01L 29/66* (2006.01)

(52) U.S. Cl.
CPC ...... *H01L 29/0804* (2013.01); *H01L 29/0821* (2013.01); *H01L 29/1004* (2013.01); *H01L 29/1095* (2013.01); *H01L 29/407* (2013.01); *H01L 29/66348* (2013.01)

(56) References Cited

U.S. PATENT DOCUMENTS

| | | | |
|---|---|---|---|
| 7,977,704 | B2 | 7/2011 | Koyama et al. |
| 2004/0041171 | A1 | 3/2004 | Ogura et al. |
| 2009/0283797 | A1 | 11/2009 | Takahashi |
| 2011/0012195 | A1 | 1/2011 | Momota et al. |
| 2013/0037853 | A1* | 2/2013 | Onozawa ............ H01L 29/0839 257/139 |
| 2014/0217464 | A1 | 8/2014 | Higuchi et al. |

FOREIGN PATENT DOCUMENTS

| | | |
|---|---|---|
| JP | 2004-022941 A | 1/2004 |
| JP | 2005-032941 A | 2/2005 |
| JP | 2006-303145 A | 11/2006 |
| JP | 2008-251620 | 10/2008 |
| JP | 2013-055361 A | 3/2013 |
| JP | 2013-084922 | 5/2013 |
| WO | 2011/111500 A1 | 9/2011 |

OTHER PUBLICATIONS

International Preliminary Report on Patentability and Written Opinion dated Nov. 3, 2016 in PCT/JP2014/078815 (submitting English language translation only).
Office Action dated Aug. 8. 2017 in Japanese Patent Application No. 2016-514680 (with partial English translation).
Office Action dated Oct. 17, 2017 in Korean Patent Application No. 10-2016-7029038 (with unedited computer generated English translation).
Office Action dated Sep. 5, 2018 in Chinese Patent Application No. 201480076678.6, with English language translation, 8 pages.

* cited by examiner

POWER SEMICONDUCTOR DEVICE

CROSS REFERENCE TO RELATED APPLICATIONS

This application is a divisional of U.S. patent application Ser. No. 15/122,261 filed Aug. 29, 2016, which is a National Stage of PCT/JP2014/078815 filed Oct. 29, 2014, and claims priority to Japanese Patent Application No. 2014-087462 filed Apr. 21, 2014. The entire contents of each of which are incorporated herein by reference.

FIELD OF THE INVENTION

The present invention relates to a power semiconductor device and, more particularly, to a semiconductor device with trench gates such as an IGBT (Insulated Gate Bipolar Transistor).

BACKGROUND OF THE INVENTION

A conduction loss of a power semiconductor device such as an IGBT can be reduced by increasing a density of trench gates formed in a stripe shape on a semiconductor substrate front surface. For example, an IGBT with trench gates (hereinafter referred to as a "trench IGBT") has an n-type emitter region, a p-type contact region, a p-type base region, an n-type base region, an n-type buffer region, and a p-type collector region formed in order on a semiconductor substrate from a surface toward a back surface thereof. Trench gates are formed into a stripe shape in the substrate front surface and are formed to penetrate the n-type emitter region and the p-type base region adjacently to the n-type emitter region and to reach the n-type base region. The p-type contact region is formed outside the n-type emitter region adjacent to each of the trench gates.

To the trench IGBT, electrons are injected from the n-type emitter region on the front surface side into the p-type base region adjacent to a trench gate. An injection amount of electrons into the p-type base region is controlled by a voltage applied to the trench gate. In particular, while an off-voltage is applied to the trench gate, electrons are not injected from the n-type emitter region on the front surface side into the p-type base region and conduction is turned off. On the other hand, while an on-voltage is applied to the trench gate, electrons are injected from the n-type emitter region on the front surface side into the p-type base region and electrons are consequently injected into the n-type base region. In an on-state, holes are injected from the p-type collector region on the back surface side via the n-buffer region into the n-type base region. Since the electrons are injected from the front surface side and the holes are injected from the back surface side, a conductivity modulation effect occurs, making carrier concentrations of electrons and holes of the n-type base region in the on-state higher by two or more orders of magnitude than an original electron concentration of the n-type base region. As a result, the resistance of the n-type base region becomes extremely low and the conduction loss can be reduced.

In a trench IGBT described in Document 1 (JP 2002-016252 A), the n-type emitter region etc. are not formed in a predetermined region between multiple trench gates formed into a stripe shape so that the trench gates not in contact with the n-type emitter region are provided. These trench gates are called dummy trench gates or inactive trench gates and are connected to an emitter electrode. By using such a structure, the trench IGBT is reduced in gate capacitance (a gate electrode-emitter electrode capacitance and a gate electrode-collector electrode capacitance) while maintaining a conduction loss.

In a trench IGBT described in Document 2 (JP 2005-032941 A), all the dummy trench gates are connected to a gate electrode to reduce a conduction loss while maintaining a gate capacitance.

SUMMARY OF THE INVENTION

For a further reduction in conduction loss of an IGBT, it is required to make a pitch of stripe-shaped trench gates narrower for higher density or to increase the number of dummy trench gates connected to an emitter electrode for a further reduction in gate capacitance. For higher performance of an IGBT used in an inverter etc., a reduction in loss at the time of a switching operation must be achieved at the same time in addition to the reduction in the conduction loss. A switching loss is made up of two components, which are a turn-on loss when the IGBT is switched from OFF to ON and a turn-off loss when the IGBT is switched from ON to OFF, and the IGBT having a higher density of trench gates and the increased number of dummy trench gates has a problem that although the conduction loss and the turn-off loss can be reduced, the turn-on loss cannot be reduced under a certain condition of a time rate of change in collector voltage.

It is therefore an object of the present invention to provide a power semiconductor device capable of reducing the turn-on loss in addition to reductions in the conduction loss and the turn-off loss even under the certain condition of the time rate of change in collector voltage.

The present invention provides a power semiconductor device controlling a current between an emitter electrode and a collector electrode with a voltage applied to a gate electrode, including:

a first-conductive-type first base region having a first principal surface and a second principal surface opposite to the first principal surface;

a second-conductive-type second base region disposed on the first principal surface of the first base region;

at least three groove parts parallel to each other disposed from a surface of the second base region through the second base region to the first base region, the groove parts including a first groove part and a third groove part arranged with a second groove part interposed therebetween; insulating films covering inner walls of the respective groove parts; conductive trench gates filled on the insulating films;

a first-conductive-type emitter region disposed in the second base region between the first groove part and the second groove part to be in contact with the first groove part, the first-conductive-type emitter region being electrically connected to the emitter electrode; and a second-conductive-type collector region disposed on the second principal surface of the first base region, the trench gates (active trench gate, active dummy trench gate) embedded in the first groove part and the third groove part being electrically connected to the gate electrode, the trench gate (isolated dummy trench gate) embedded in the second groove part being electrically connected to the emitter electrode.

According to the present invention, while ON/OFF of a collector current is controlled with a gate potential applied to an active trench gate (6a), a conductivity modulation effect contributive to the collector current can be enhanced by disposing isolated dummy trench gates (6b) fixed to an emitter potential with the active trench gate (6a) interposed therebetween. Additionally, by disposing active dummy trench gates (6c) fixed to the gate potential such that these trench gates are interposed therebetween, a time rate of change in collector voltage can be made more gradual by a parasitic capacitance between a gate electrode and a collector electrode, and a turn-on loss can be reduced under a certain condition of the time rate of change in collector voltage.

DETAILED DESCRIPTION OF THE PREFERRED EMBODIMENTS

First Embodiment

Figure 1:
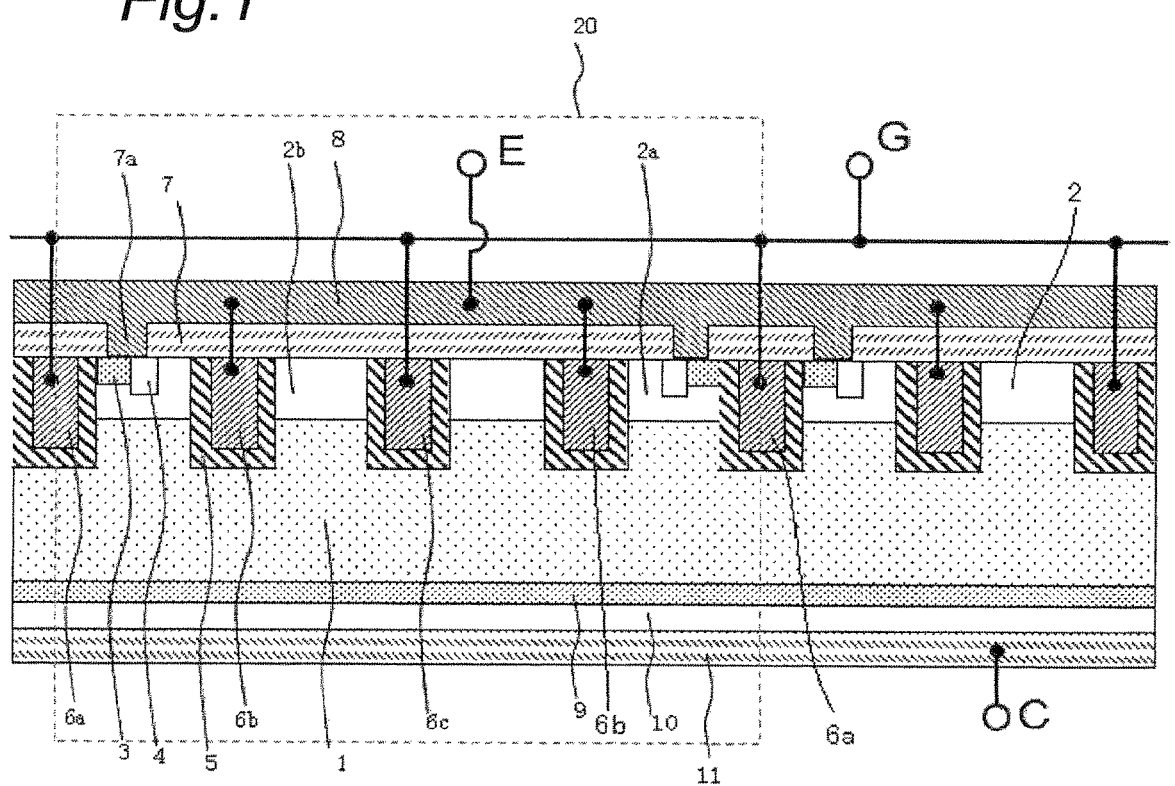
FIG. 1 is a cross-sectional view of a trench IGBT according to a first embodiment of the present invention.

FIG. 1 is a cross-sectional view of a vertical trench IGBT according to a first embodiment of the present invention generally denoted by 20 and a portion surrounded by a dashed line is a unit IGBT. The trench IGBT 20 includes an n-type (first-conductive-type) base region 1 (a first-conductive-type first base region) having a first principal surface (front surface) and a second principal surface (back surface) opposite to the first principal surface. The front surface of the n-type base region 1 on the first principal surface side includes a selectively formed p-type (second-conductive-type) base region 2.

The trench IGBT 20 includes n-type emitter regions 3 (first-conductive-type emitter regions) selectively formed shallower than the p-type base region 2 in a stripe shape in the front surface of the p-type base region 2 on the first principal surface side and p-type contact regions 4 (second-conductive-type first contact regions) formed shallower than the p-type base region 2.

The trench IGBT 20 includes stripe-shaped groove parts reaching from the first principal surface to the n-type base region 1, gate insulating films 5 formed to cover surfaces inside the groove parts, and first trench gates (referred to as "active trench gates") 6a formed on the gate insulating films 5 to fill the groove parts. The n-type emitter regions 3 are formed in contact with the groove parts interposed therebetween. The trench IGBT 20 includes an interlayer insulating film 7 on the front surface of the p-type base region 2 on the first principal surface side and includes on the interlayer insulating film 7 an emitter electrode 8 electrically connected to the n-type emitter regions 3 and the p-type contact regions 4.

The trench IGBT 20 also includes stripe-shaped groove parts formed from the first principal surface to the n-type base region 1 on the both sides of each of the first trench gates 6a interposed therebetween, the gate insulating films 5 formed to cover inner surfaces of the groove parts, and second trench gates (referred to as "isolated dummy trench gates") 6b formed on the gate insulating films 5 to fill the groove parts.

The trench IGBT 20 further includes stripe-shaped groove parts formed from the first principal surface to the n-type base region 1 on the outsides of the two second trench gates 6b disposed on the both sides of each of the first trench gates 6a and interposed therebetween, the gate insulating films 5 formed to cover surfaces inside the groove parts, and third trench gates (referred to as "active dummy trench gates") 6c formed on the gate insulating films 5 to fill the groove parts. Therefore, the trench IGBT 20 includes three types of trench gates, which are the active trench gates 6a, the isolated dummy trench gates 6b, and the active dummy trench gates 6c. The respective types of the trench gates have the following characteristics.

Active trench gates 6a: The n-type emitter regions 3 are formed along walls on the both sides of each of the trench gates. A drive voltage is applied. The trench gates control electron injection from the n-type emitter regions via the p-type base region to the n-type base region in accordance with the drive voltage.

Active dummy trench gates 6c: No emitter region is formed along walls on the both sides of each of the trench gates. A drive voltage is applied. The trench gates act as a feedback capacitance element between a gate and a collector.

Isolated dummy trench gates 6b: Then-type emitter regions 3 may or may not be formed along walls on the both sides of each of the trench gates. The trench gates are connected to the emitter electrode.

The trench IGBT 20 also includes a gate electrode (G) connected to the first trench gates 6a and the third trench gates 6c, and the emitter electrode 8 (E) connected to the second trench gates 6b.

On the other hand, the trench IGBT 20 includes an n-type buffer region 9 (a first-conductive-type buffer region), a p-type collector region 10 (a second-conductive-type collector region), and a collector electrode 11 (C) electrically connected to the p-type collector region 10 formed in order on the second principal surface side of the n-type base region 1.

Figure 2A:
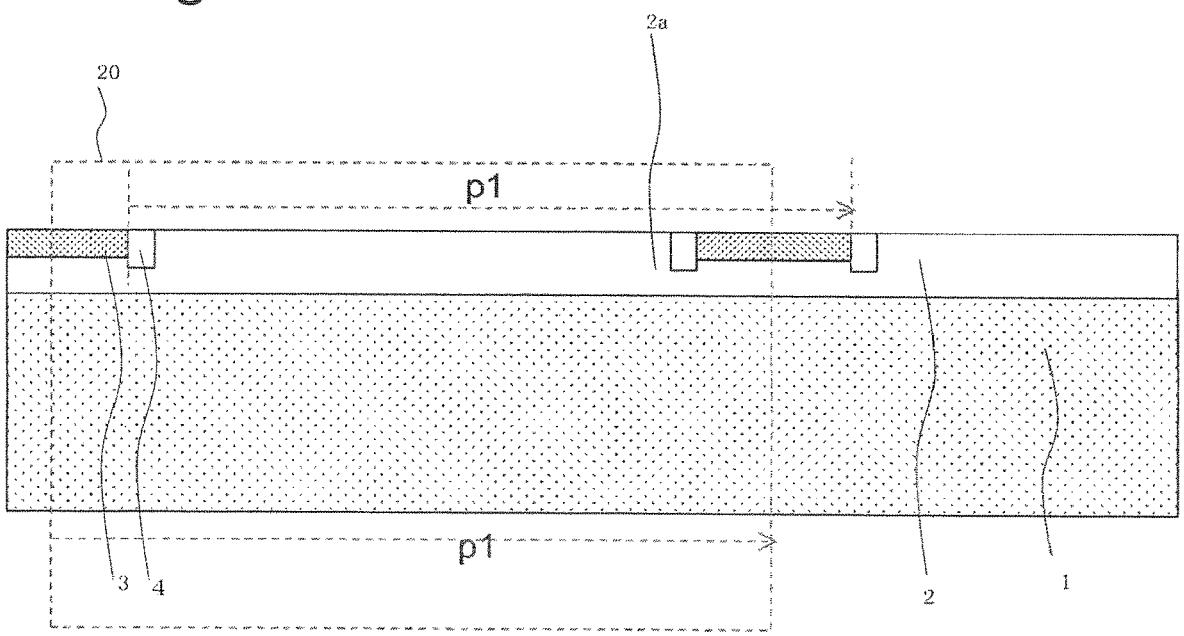
FIG. 2a is a cross-sectional view of a manufacturing step of the trench IGBT according to the first embodiment of the present invention.

A method of manufacturing the trench IGBT 20 will be described with reference to FIG. 2a to FIG. 4b. FIGS. 2a, 3a, and 4a are cross-sectional views of manufacturing steps and correspond to cross sections taken along A-A of plane views shown in FIGS. 2b, 3b, and 4b.

Figure 2B:
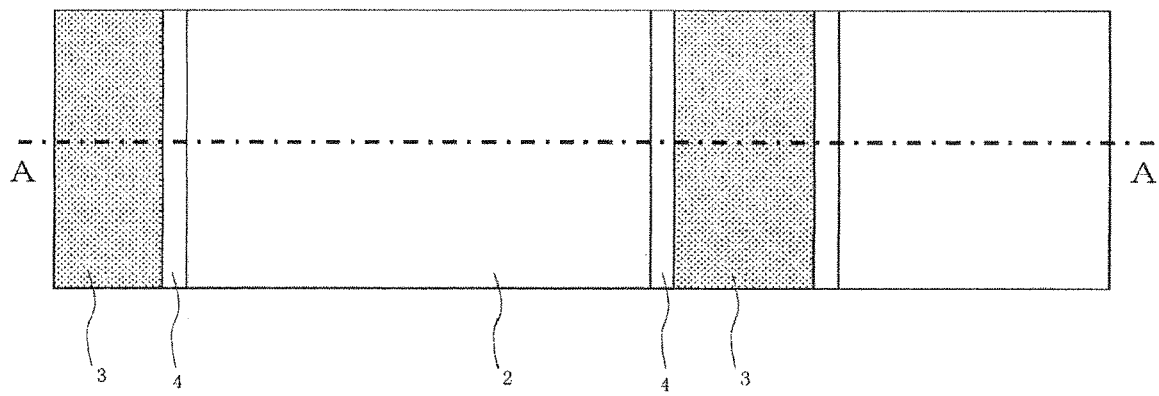
FIG. 2b is a top view of the manufacturing step of the trench IGBT according to the first embodiment of the present invention.
Figure 3A:
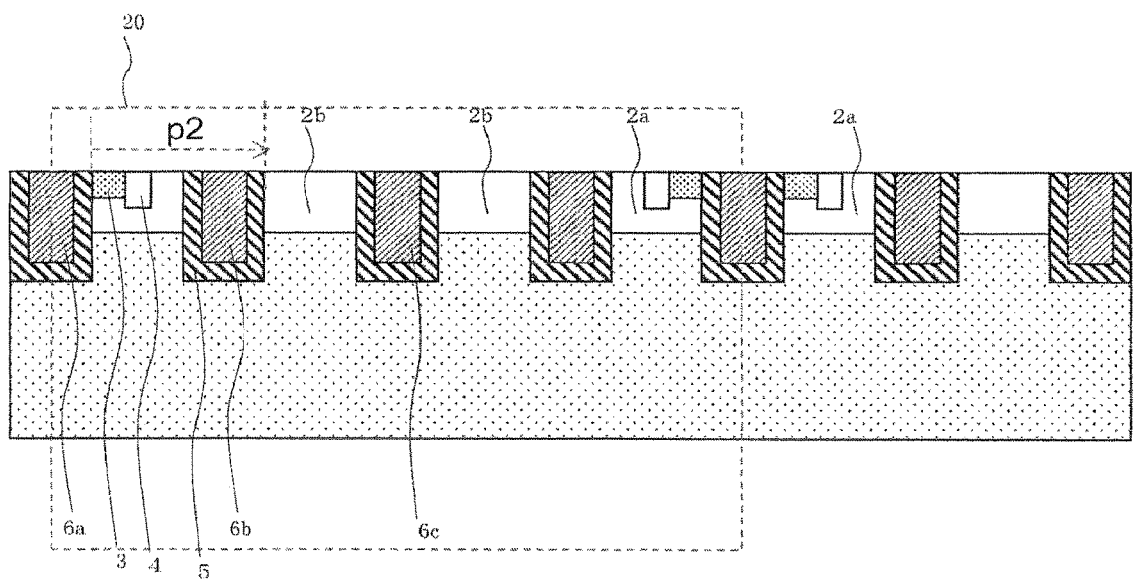
FIG. 3a is a cross-sectional view of a manufacturing step of the trench IGBT according to the first embodiment of the present invention.

In the method of manufacturing the trench IGBT 20, first, as shown in FIGS. 2a and 2b, an n-type silicon substrate fabricated by an FZ (Floating Zone) method is prepared. Various regions are formed in the silicon substrate in the following steps and a remaining portion without the various regions formed therein acts as the n-type base region 1 that is a drift layer.

Subsequently, photolithography, ion implantation, and heat treatment are performed at a predetermined position of the prepared silicon substrate front surface to form the p-type base region 2 (2a, 2b). Specifically, as shown in FIG. 2a, the p-type base region 2 is formed on the front surface side of the silicon substrate. The p-type base region 2 has a thickness of about 1 to 4 μm.

Photolithography, ion implantation, and heat treatment are then performed at predetermined positions of the p-type base region 2 to form the n-type emitter regions 3 and the p-type contact regions 4. Specifically, as shown in FIG. 2b, the n-type emitter regions 3 are formed at constant intervals (constant pitches, pitch length: p1) into a stripe shape and the p-type contact regions 4 are repeatedly formed adjacently to the n-type emitter regions 3.

Figure 3B:
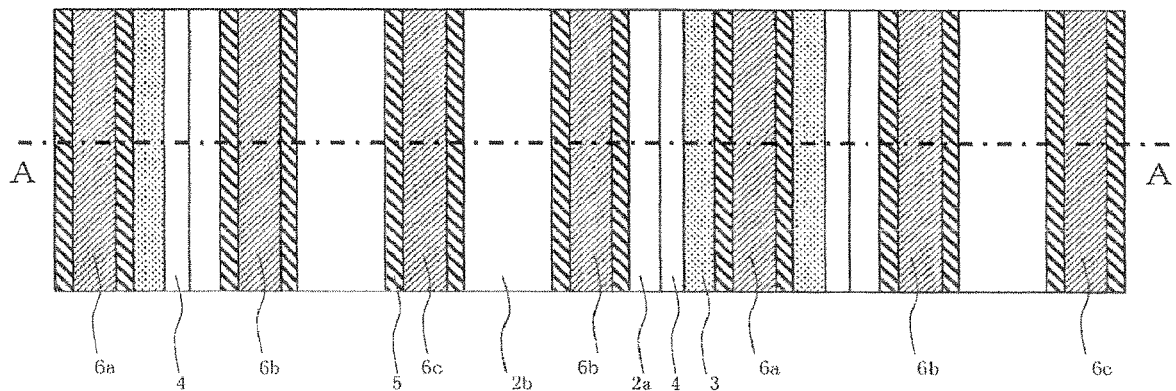
FIG. 3b is a top view of the manufacturing step of the trench IGBT according to the first embodiment of the present invention.
Figure 4A:
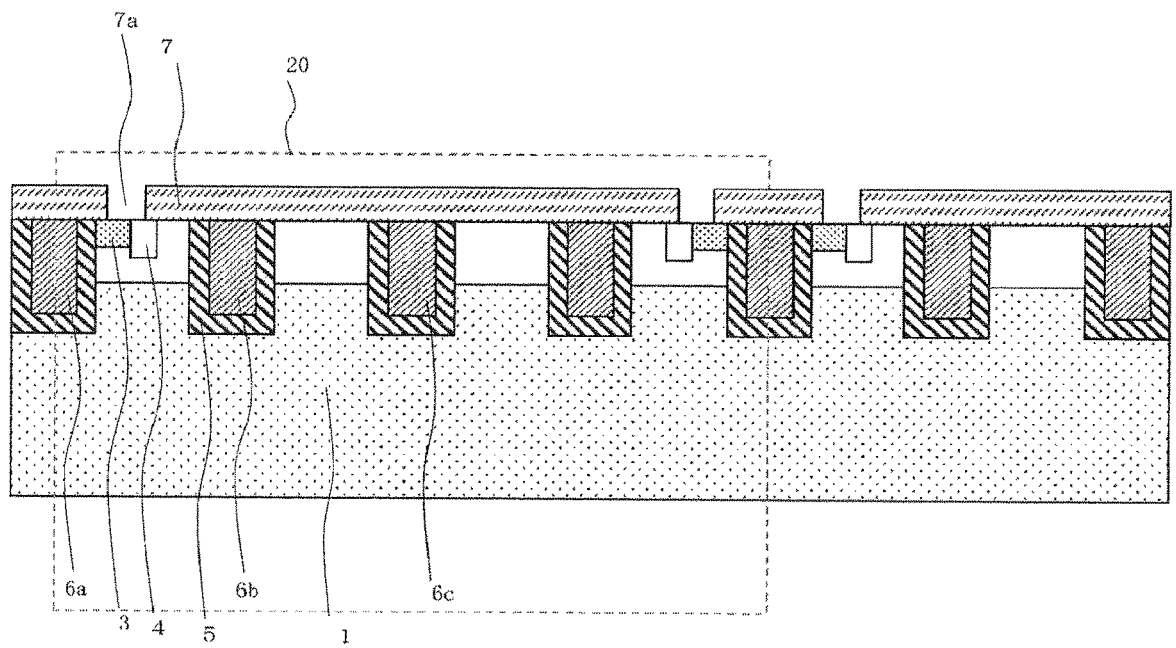
FIG. 4a is a cross-sectional view of a manufacturing step of the trench IGBT according to the first embodiment of the present invention.

Subsequently, as shown in FIGS. 3a and 3b, the groove parts are formed at constant intervals (constant pitches, pitch length: p2) into a stripe shape. Some of the groove parts are formed inside the n-type emitter regions 3 to divide the n-type emitter regions 3. The groove parts are formed to penetrate from the silicon substrate front surface through the p-type base region 2 (and the n-type emitter regions 3) to the n-type base region 1, i.e., to hollow out an upper part of the p-type base region 1. The depth of the groove parts is a constant depth from the silicon substrate front surface and is about 1 to 8 μm, which is deeper than the thickness of the p-type base region 2.

The p-type base regions 2 separated by the groove parts are referred to as p-type base regions 2a if the n-type emitter region 3 and the p-type contact region 4 are formed therein, and are referred to as p-type base regions 2b if neither of the regions is formed therein.

The gate insulating films 5 are then formed along the inner walls of the groove parts. Subsequently, an n-type polysilicon is inserted to fill the groove parts provided with the gate insulating films 5, thereby forming trench gates 6. Among the trench gates 6, those formed in the groove parts sectionalizing the n-type emitter regions 3 are defined as first trench gates 6a and referred to as the active trench gates. Those formed in the groove parts on the both sides of each of the first trench gates 6 interposed therebetween are defined as second trench gates 6b and referred to as the isolated dummy trench gates. Those formed in the groove parts on the sides opposite to the first trench gates 6a across the second trench gates 6b are defined as third trench gates 6c and referred to as active dummy trench gates. In other words, the isolated dummy trench gates 6b are arranged on the both sides of each of the active trench gates 6a, and the active dummy trench gates 6c are arranged on the outer side thereof.

Figure 4B:
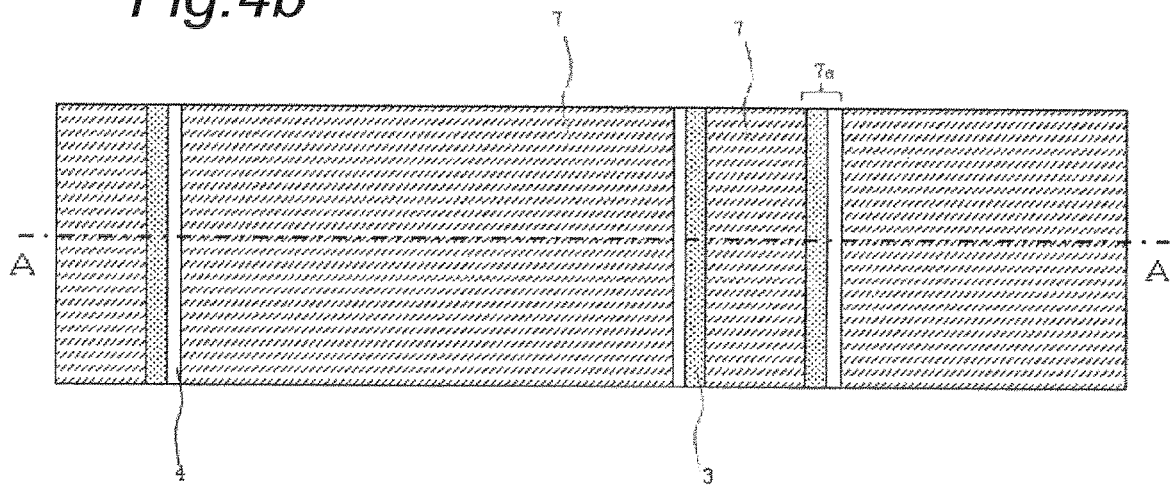
FIG. 4b is a top view of the manufacturing step of the trench IGBT according to the first embodiment of the present invention.

Subsequently, as shown in FIGS. 4a and 4b, the interlayer insulating film 7 is formed to cover the silicon substrate front surface in which the first, second, and third trench gates 6a, 6b, 6c etc. are formed. The interlayer insulating film 7 is made of a silicon oxide film, for example. Opening regions 7a are formed in the interlayer insulating film 7 such that the n-type emitter regions 3 and the p-type contact regions 4 are at least partially exposed.

The emitter electrode 8 is formed on the interlayer insulating film 7 to be electrically connected to the n-type emitter regions 3 and the p-type contact regions 4.

The n-type buffer region 9 is then formed on the second principal surface (back surface) of the n-type base region 1 (the silicon substrate) and the p-type collector region 10 is formed thereon. Subsequently, the collector electrode 11 is formed on the p-type collector region 10 to be electrically connected to the p-type collector region 10.

The trench IGBT 20 shown in FIG. 1 is completed by the manufacturing steps described above.

Figure 5:
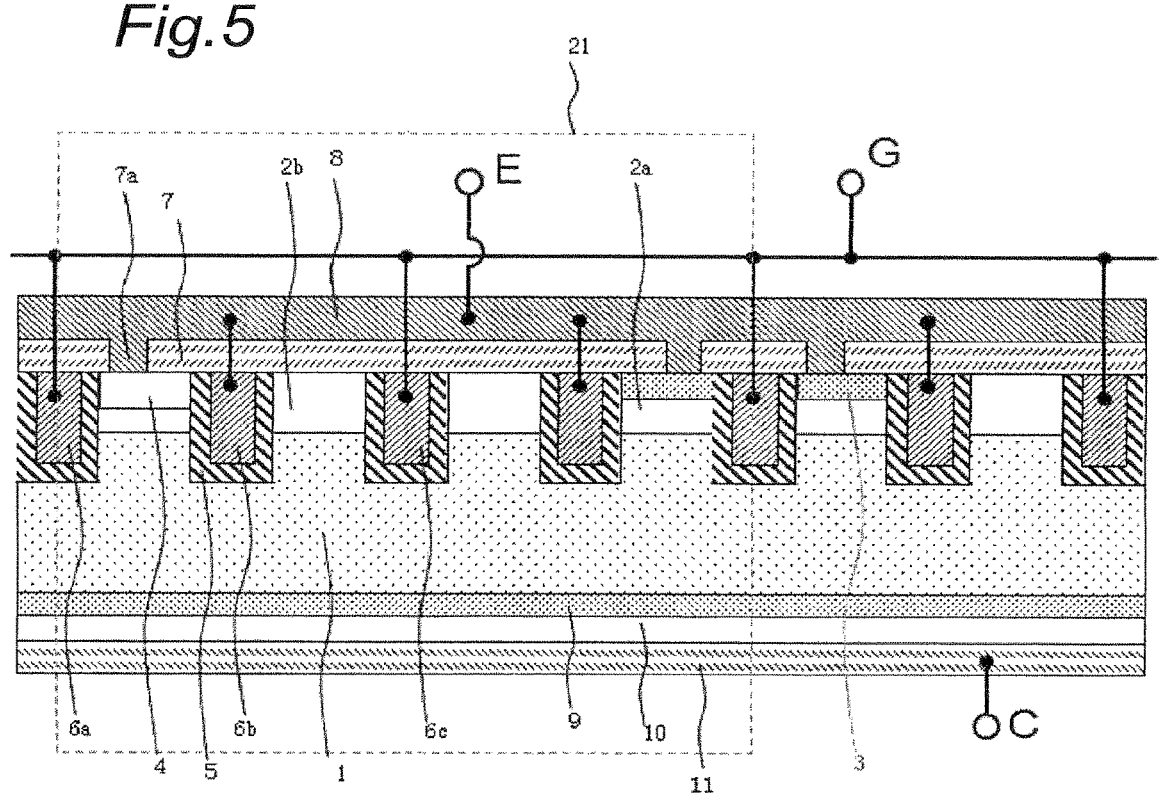
FIG. 5 is a cross-sectional view of another trench IGBT according to the first embodiment of the present invention.
Figure 6A:
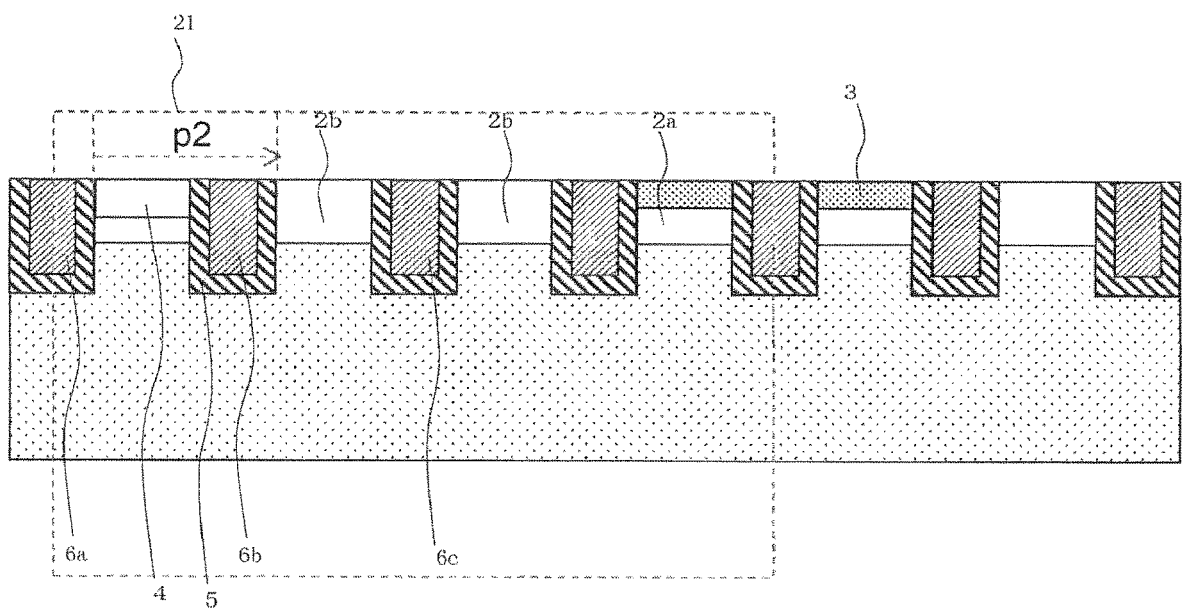
FIG. 6a is a cross-sectional view of a manufacturing step of the other trench IGBT according to the first embodiment of the present invention.
Figure 6B:
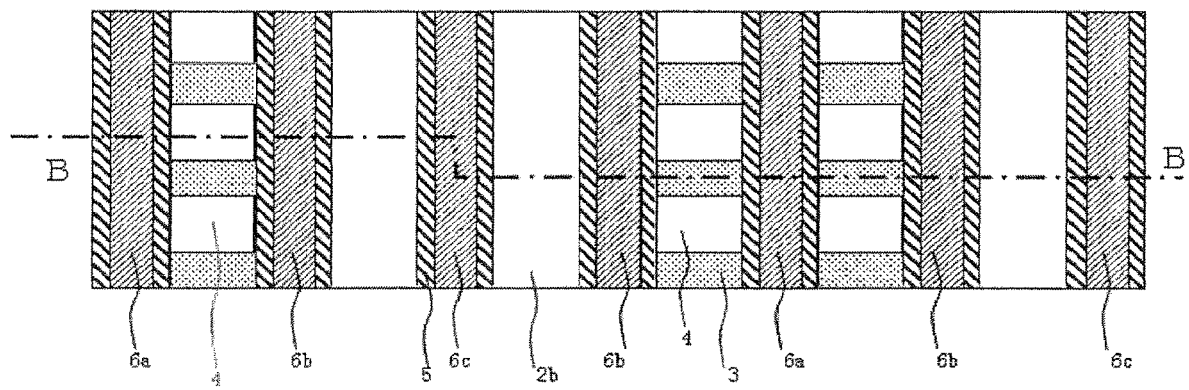
FIG. 6b is a top view of the manufacturing step of the other trench IGBT according to the first embodiment of the present invention.

FIG. 5 is a cross-sectional view (modification example 1) of another vertical trench IGBT according to the first embodiment of the present invention generally denoted by 21 and a portion surrounded by a dashed line is a unit IGBT. FIGS. 6a and 6b are a cross-sectional view and a top view of a manufacturing step and FIG. 6a corresponds to a cross section taken along B-B of FIG. 6b. In FIGS. 5, 6a, and 6b, the same reference numerals as FIG. 1 denote the same or corresponding portions. FIG. 5 corresponds to a cross section taken along B-B of FIG. 6b.

As apparent from comparison between FIGS. 3a and 3b with FIGS. 6a and 6b, the trench IGBT 21 is different from the trench IGBT 20 in arrangement (shape) of the n-type emitter regions 3 and the P-type contact regions 4. In particular, in FIG. 3b, the n-type emitter regions 3 and the p-type contact regions 4 are formed inside the p-type base regions 2a in parallel with the first trench gates 6a, while in FIG. 6b, the n-type emitter regions 3 and the p-type emitter regions 4 are alternately repeatedly formed inside the p-type base region 2a in a direction along the first trench gate 6a. The other configurations are the same as the IGBT 20.

Since the trench IGBT 21 has the n-type emitter regions 3 and the p-type emitter regions 4 alternately arranged, even when some misalignment occurs in the step of forming the contact opening regions 7a in the interlayer insulating film 7 shown in FIG. 4a, both the n-type emitter regions 3 and the p-type emitter regions 4 can be opened and a process margin can be increased.

Figure 7:
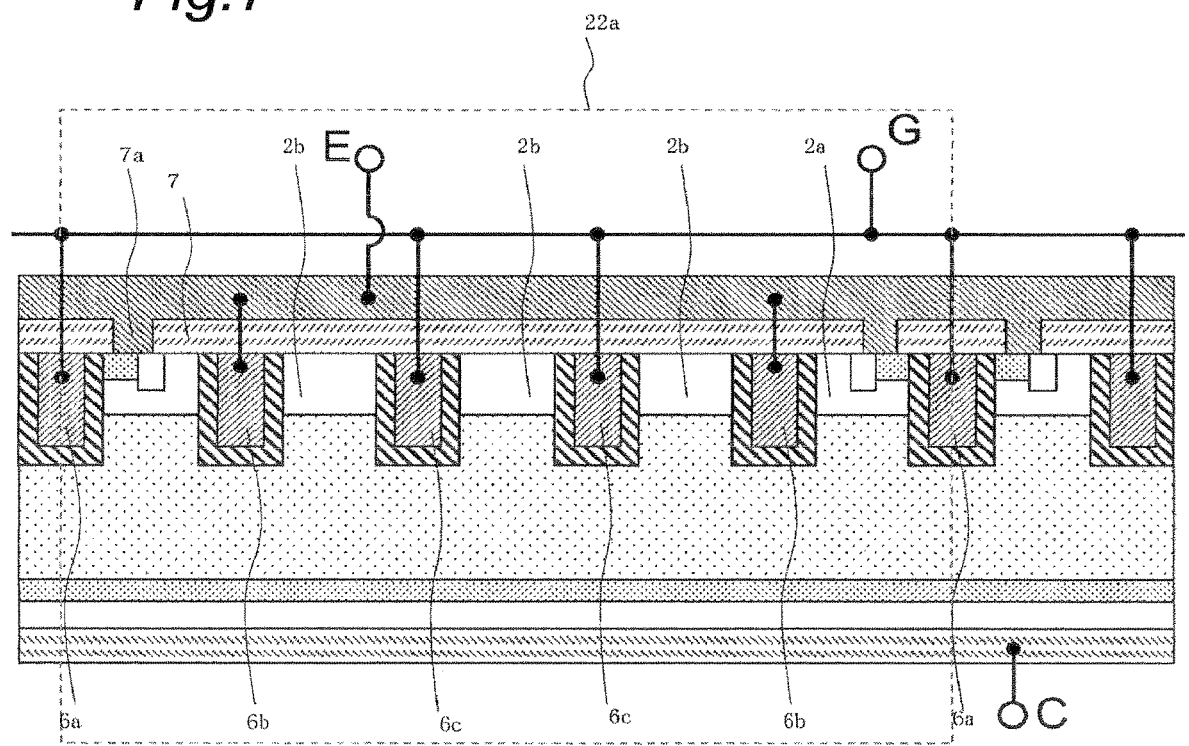
FIG. 7 is a cross-sectional view of a further trench IGBT according to the first embodiment of the present invention.

FIG. 7 is a cross-sectional view (modification example 2) of a further vertical trench IGBT according to the first embodiment of the present invention generally denoted by 22a and a portion surrounded by a dashed line is a unit IGBT. In FIG. 7, the same reference numerals as FIG. 1 denote the same or corresponding portions.

As apparent from comparison between FIG. 7 with FIG. 1, the trench IGBT 22a is different from the trench IGBT 20 in arrangement of the active dummy trench gates 6c. In particular, while the trench IGBT 20 has the one active dummy trench gate 6c disposed and interposed between the two isolated dummy trench gates 6b, the trench IGBT 22a of FIG. 7 has the two active dummy trench gates 6c disposed and interposed between the two isolated dummy trench gates 6b.

The action and effect of the trench IGBT 22a will be described in comparison with a comparison example shown in FIG. 8. The trench IGBT 22a and the IGBT 20 have the same configuration except the number of the active dummy trench gates and therefore have substantially the same action and effect.

Figure 8:
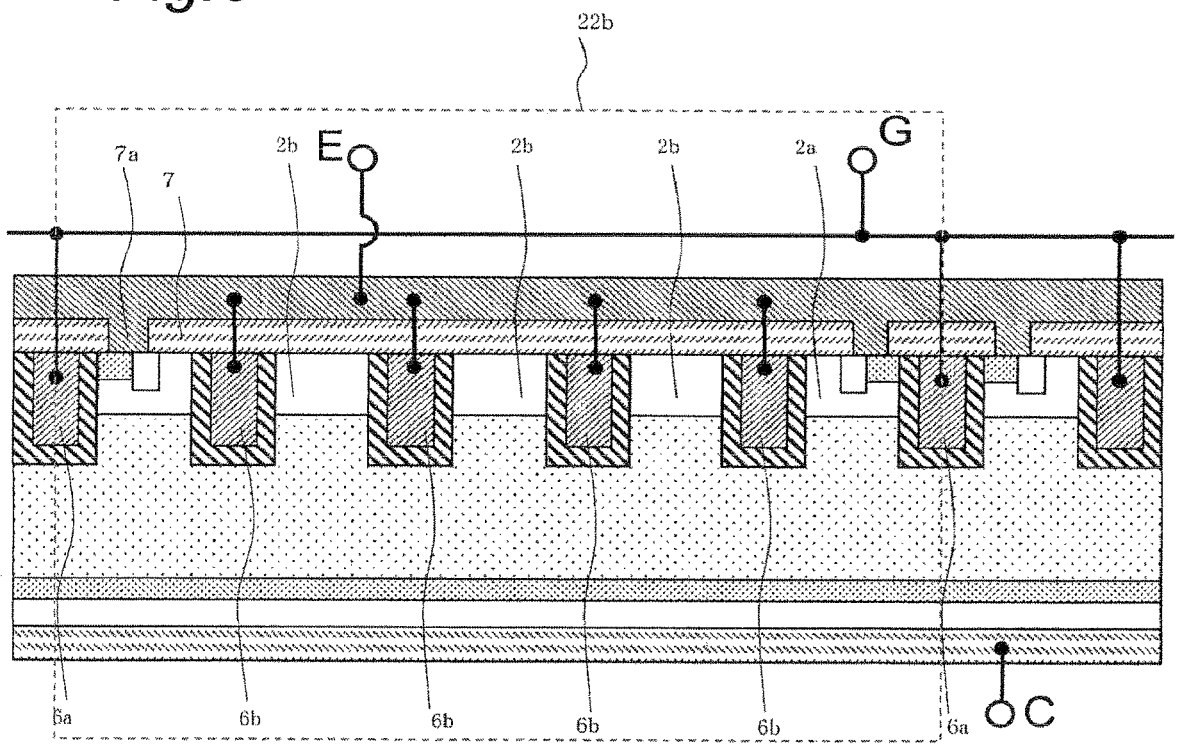
FIG. 8 is a cross-sectional view of a trench IGBT according to a comparison example.

In a trench IGBT 22b of the comparison example shown in FIG. 8, the active dummy trench gates 6c included in the trench IGBT 22a shown in FIG. 7 are not formed and the typical dummy trench gates 6b are formed instead. Therefore, the trench IGBT 22b has a structure in which the four dummy trench gates 6b are interposed between the two trench gates 6a.

Figure 9:
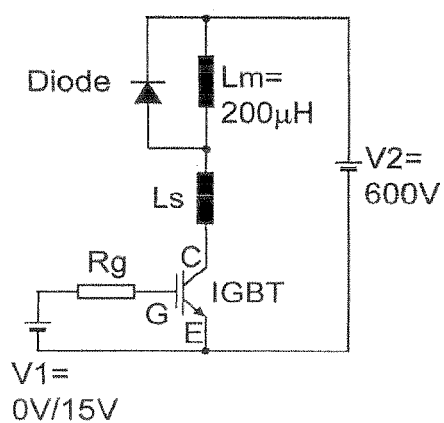
FIG. 9 is a circuit diagram of a switching test circuit of a trench IGBT.

FIG. 9 is a circuit diagram of a half-bridge evaluation circuit for power conversion used for evaluating the trench IGBT 22a according to the first embodiment of the present invention and the trench IGBT 22b according to the comparison example. As shown in FIG. 9, the half-bridge evaluation circuit has the external resistor Rg and a gate-application pulse power source (V1) connected to a gate electrode (G) of an IGBT. A parasitic inductance (Ls), a load inductance (Lm), and a DC power source (V2) are connected to a collector electrode (C) of the IGBT. A free wheel diode (Diode) for reflux is connected in parallel with the load inductance.

The half-bridge evaluation circuit of FIG. 9 uses, for example, the voltage value V1 of 15 V/0 V for the power source for applying a gate voltage, the parasitic inductance Ls of 50 pH, the load inductance Lm of 200 pH, the voltage value of 600 V for a DC power source, and the external resistor Rg made variable. The IGBT has a rated current of 150 A and a rated voltage of 1200 V.

Figure 10A:
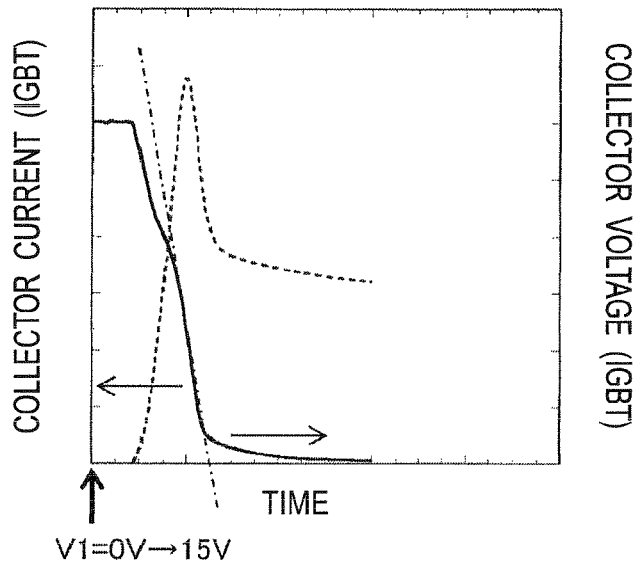
FIG. 10a is a diagram of a turn-on characteristic waveform in a switching test of the further trench IGBT according to the first embodiment of the present invention.
Figure 10B:
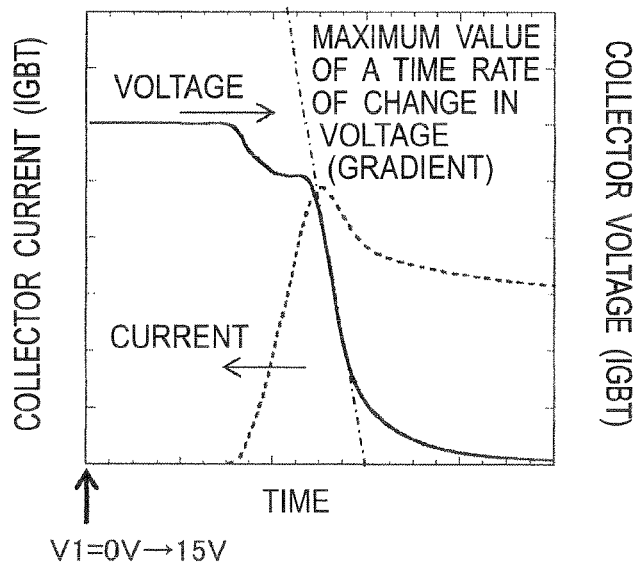
FIG. 10b is a diagram of a turn-on characteristic waveform in a switching test of the trench IGBT according to the comparison example.

FIGS. 10a and 10b show device simulation results of switching tests using the half-bridge evaluation circuit of FIG. 9 at the test temperature set to 125° C.

FIG. 10a shows waveforms of collector voltage and collector current when the trench IGBT 22a according to the first embodiment of the present invention is turned on and FIG. 10b shows waveforms of voltage and current when the trench IGBT 22b of the comparison example is turned on. In FIGS. 10a and 10b, solid lines indicate the collector voltages and dashed lines indicate the collector currents. In FIGS. 10a and 10b, the variable external resistor Rg is adjusted such that time rates of change in voltage (dV/dt) have the maximum values at the same level in the collector voltage waveforms. Therefore, it is apparent that the external resistor Rg applied to the IGBT 22a according to the first embodiment of the present invention has a value lower than that applied to the IGBT 22b of the comparison example and results in a faster turn-on operation.

Figure 11:
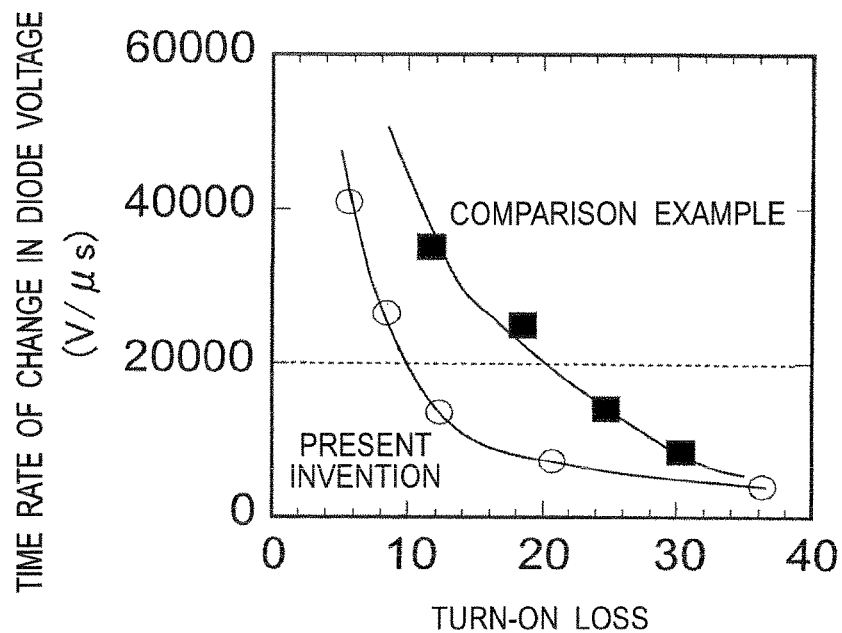
FIG. 11 is a diagram of a relation between a turn-on loss and a time rate of change in diode voltage of the further trench IGBT according to the first embodiment of the present invention and the trench IGBT according to the comparison example.

FIG. 11 shows a relation between the turn-on loss of the IGBTs acquired from the relation of voltage and current waveforms of FIGS. 10a and 10b and the maximum value of a time rate of change in voltage of the free wheel diode (Diode). The horizontal axis of FIG. 11 indicates the turn-on loss of the IGBTs at the collector current of 150 A calculated by using the external resistor Rg shown in the circuit diagram of FIG. 9 as a parameter. On the other hand, the vertical axis indicates the time rate of change in voltage on the diode side at the collector current of 1.5 A (one hundredth of the collector current value described above) calculated with the external resistance value thereof.

From FIG. 11, it can be seen that the turn-on loss of the trench IGBT 22a is about a half of that of the trench IGBT 22b of the comparison example under the condition that the time rate of change of the diode is 20000 V/μs (indicated by a dashed line of FIG. 11). Therefore, the turn-on loss is made smaller by using the trench IGBT 22a according to the first embodiment. This is attributable to a feedback capacitance between the gate electrode (G) connected to the active dummy trench gates 6c and the collector electrode (C) made larger by disposing the active dummy trench gates 6c as compared to the trench IGBT 11b according to the comparison example.

As described above, in the first embodiment of the present invention, since the isolated dummy trench gates 6b connected to the emitter electrode are arranged such that the first trench gates 6a connected to the gate electrode providing control of ON/OFF of the collector current are each interposed therebetween, and the active dummy trench gates 6c connected to the gate electrode are arranged such that the isolated dummy trench gates 6b are interposed therebetween, the feedback capacitance between the gate electrode and the collector electrode can be made larger as compared to conventional trench IGBTs. As a result, the turn-on loss of the IGBT can be reduced while suppressing the time rate of change in voltage of a diode for reflux at the time of turn-on operation of the IGBT.

Since the isolated dummy trench gates 6b connected to the emitter electrode are arranged between the active trench gates 6a connected to the gate electrode and the active dummy trench gates 6c, mutual interference is suppressed between the active trench gates 6a and the active dummy trench gates 6c and stable switching and load short-circuit operations are acquired.

Although the one isolated dummy trench gate 6b is disposed between the active trench gate 6a and the active dummy trench gate 6c in FIGS. 1, 5, and 7, the two or more isolated dummy trench gates 6b may be disposed.

Second Embodiment

Figure 12:
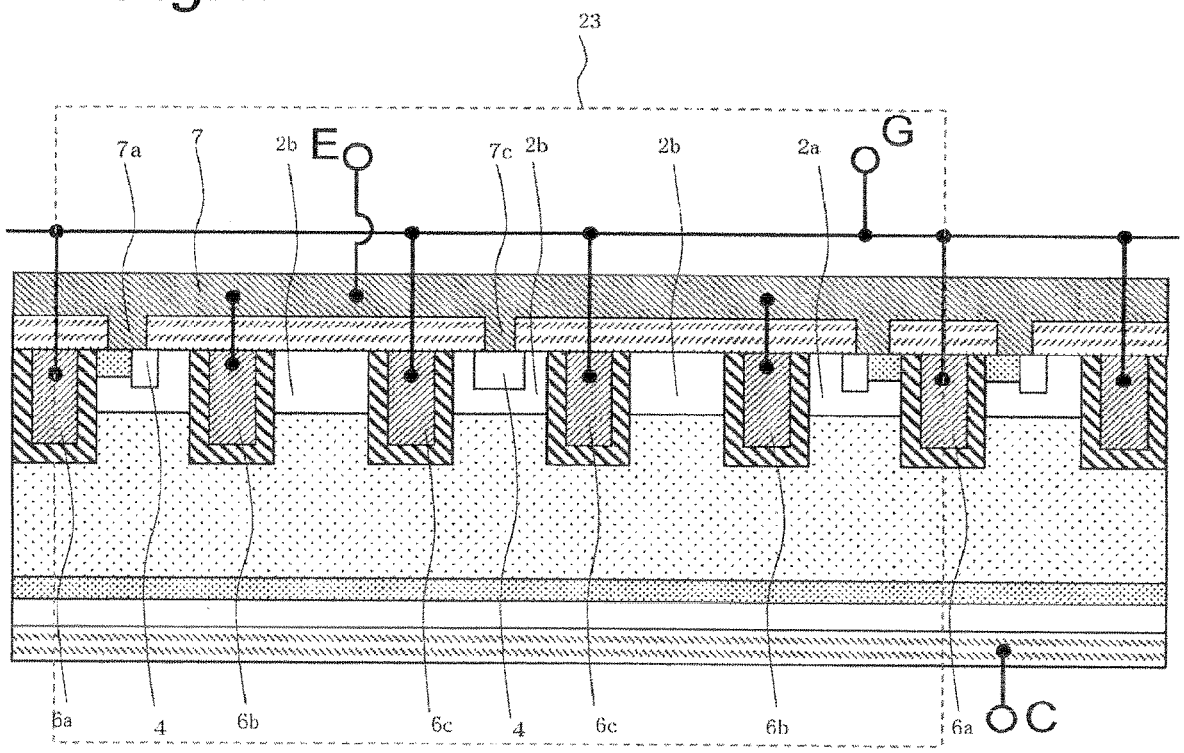
FIG. 12 is a cross-sectional view of a trench IGBT according to a second embodiment of the present invention.

FIG. 12 is a cross-sectional view of a trench IGBT according to a second embodiment of the present invention generally denoted by 23 and a portion surrounded by a dashed line is a unit IGBT. In FIG. 12, the same reference numerals as FIG. 1 denote the same or corresponding portions.

The trench IGBT 23 according to the second embodiment of the present invention has a structure having the p-type contact region 4 disposed in the p-type base region 2b interposed between the two active dummy trench gates 6c in the trench IGBT 22a (see FIG. 7) according to the modification example of the first embodiment. An opening region 7c is formed in the interlayer insulating film 7 such that the p-type contact region 4 is partially exposed, and the p-type contact region 4 is connected to the emitter electrode 8.

Since only the p-type base region 2b interposed between the two active dummy trench gates 6c is provided with the p-type contact region 4 as described above, although a portion of the feedback capacitance between the gate electrode (G) connected to the active dummy trench gates 6c and the collector electrode (C) is repriced by a capacitance between the gate electrode (G) and the emitter electrode (E), the feedback capacitance is larger than the conventional trench IGBTs and, therefore, the turn-on loss of the IGBT can be reduced while suppressing the time rate of change in voltage of a diode for reflux at the time of turn-on operation of the IGBT.

Since the p-type base region 2b interposed between the two active dummy trench gates 6c is provided with the p-type contact region 4 connected to the emitter electrode 8, holes can efficiently be discharged out of carriers including electrons and holes, which enables a stable operation particularly at the time of a load short circuit.

Third Embodiment

Figure 13:
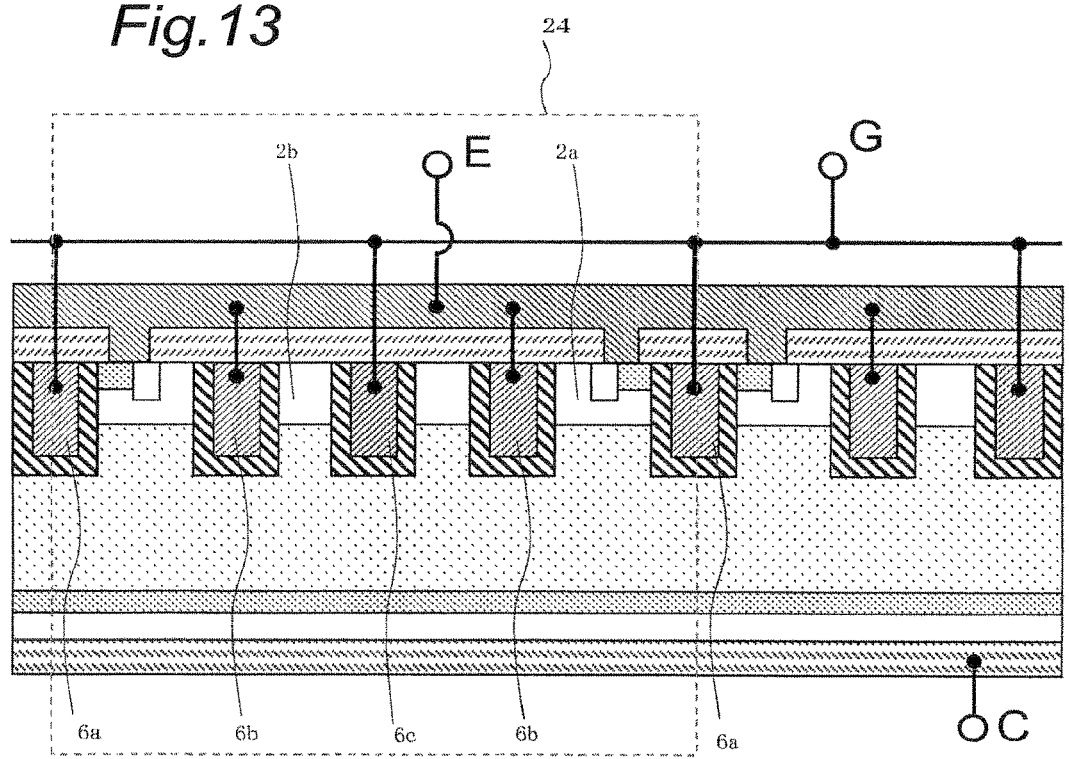
FIG. 13 is a cross-sectional view of a trench IGBT according to a third embodiment of the present invention.

FIG. 13 is a cross-sectional view of a trench IGBT according to a third embodiment of the present invention generally denoted by 24 and a portion surrounded by a dashed line is a unit IGBT. In FIG. 13, the same reference numerals as FIG. 1 denote the same or corresponding portions.

The trench IGBT 24 according to the third embodiment of the present invention has a structure having a distance between the isolated dummy trench gate 6b and the active dummy trench gate 6c made narrower as compared to a distance between the active trench gate 6a and the isolated dummy trench gate 6b in the trench IGBT 20 (see FIG. 1) according to the first embodiment. Therefore, since it is not necessary to dispose a contact region in the p-type base region between the isolated dummy trench 6b and the active dummy trench gate 6c, the distance between the isolated dummy trench gate 6b and the active dummy trench gate 6c can be reduced to a minimum design rule of a semiconductor process.

In the trench IGBT 24 according to the third embodiment of the present invention, since the feedback capacitance between the gate electrode (G) connected to the active dummy trench gates 6c and the collector electrode (C) is the same as the trench IGBT 20 according to first embodiment, the turn-on loss of the IGBT can be reduced while suppressing the time rate of change in voltage of a diode for reflux at the time of turn-on operation of the IGBT.

Additionally, since the distance between the isolated dummy trench gate 6b and the active dummy trench gate 6c is made narrower as compared to the distance between the active trench gate 6a and the isolated dummy trench gate 6b, a proportion of the active trench gate 6a per unit area can be made larger and the collector current can be increased as compared to the collector current of the trench IGBT 20 according to the first embodiment.

Fourth Embodiment

Figure 14:
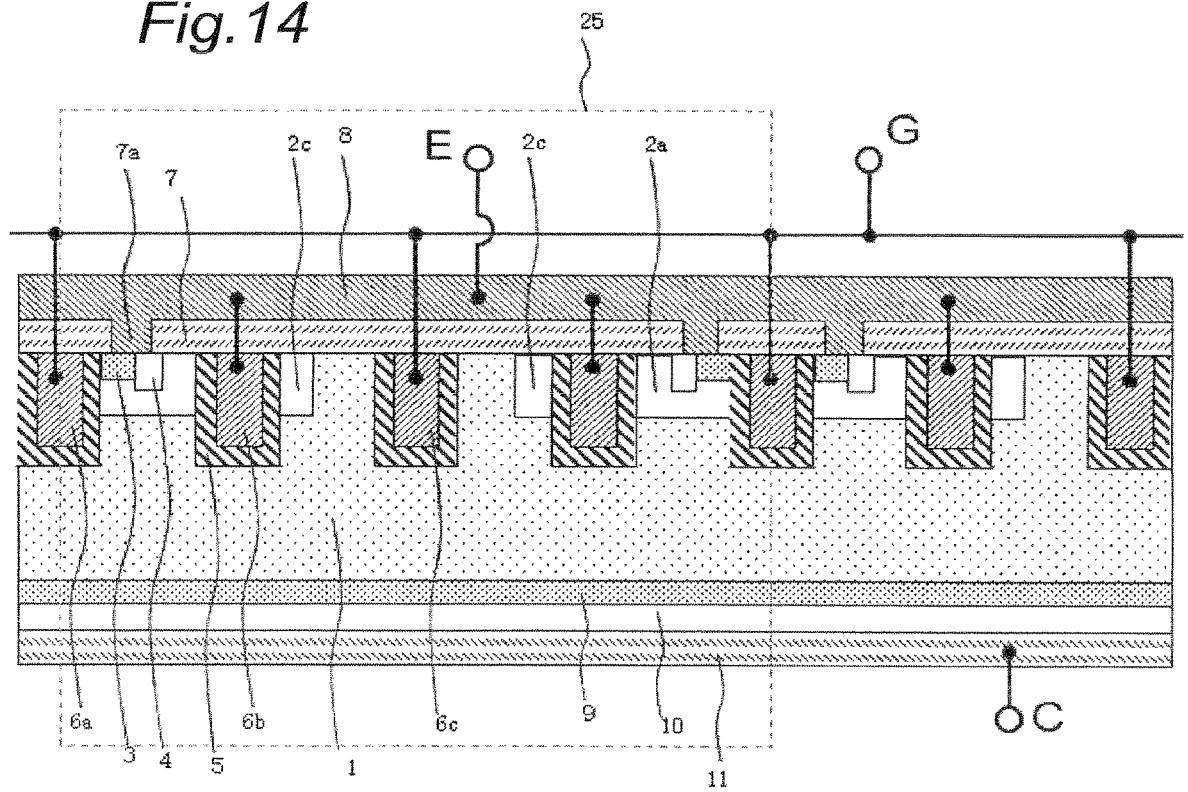
FIG. 14 is a cross-sectional view of a trench IGBT according to a fourth embodiment of the present invention.
Figure 15:
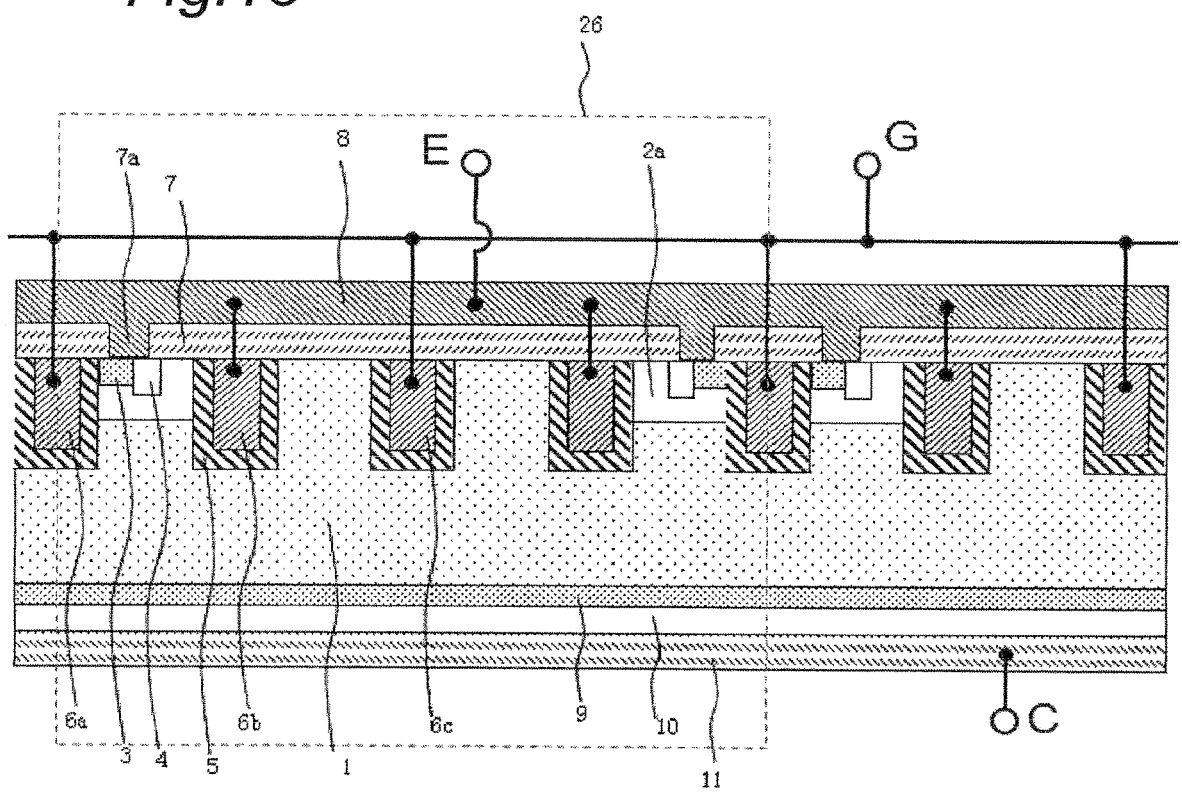
FIG. 15 is a cross-sectional view of another trench IGBT according to the fourth embodiment of the present invention.

FIG. 14 is a cross-sectional view of a trench IGBT according to a fourth embodiment of the present invention generally denoted by 25 and a portion surrounded by a dashed line is a unit IGBT. FIG. 15 is a cross-sectional view of another trench IGBT according to the fourth embodiment of the present invention generally denoted by 26 and a portion surrounded by a dashed line is a unit IGBT. In FIGS. 14 and 15, the same reference numerals as FIG. 1 denote the same or corresponding portions.

The trench IGBT 25 according to the fourth embodiment of the present invention has a structure having the p-type base region 2c disposed to be in contact only with the groove part in which the isolated dummy trench gate 6b is formed instead of the p-type base region 2b interposed between the isolated dummy trench gate 6b and the active dummy trench gate 6c in the trench IGBT 20 (see FIG. 1) according to the first embodiment.

Since the p-type base region 2c is disposed to be in contact only with the groove part in which the isolated dummy trench gate 6b is formed ad described above, the feedback capacitance between the gate electrode (G) connected to the active dummy trench gates 6c and the collector electrode (C) can be increased as compared to the trench IGBT 20 and the turn-on loss of the IGBT can be reduced while suppressing the time rate of change in voltage of a diode for reflux at the time of turn-on operation of the IGBT.

As shown in FIG. 15, the other trench IGBT 26 according to the fourth embodiment of the present invention has a structure without the p-type base region 2b disposed in the region interposed between the isolated dummy trench gate 6b and the active dummy trench gate 6c in the trench IGBT 20 (see FIG. 1).

Since the p-type base region 2b is not disposed as described above, the feedback capacitance between the active dummy trench gate 6c and the n-type base region 1 can be increased and the turn-on loss of the IGBT can be reduced while suppressing the time rate of change in voltage of a diode for reflux at the time of turn-on operation of the IGBT.

Although the one isolated dummy trench gate 6b is disposed between the active trench gate 6a and the active dummy trench gate 6c in FIGS. 14 and 15, the two or more isolated dummy trench gates 6b may be disposed. As is the case with FIG. 7, the two or more active dummy trench gates 6c may be disposed between the two isolated dummy trench gates 6b. As is the case with FIG. 5, the n-type emitter regions 3 and the p-type emitter regions 4 may alternately repeatedly be arranged inside the p-type base region 2a in a direction along the first trench gate 6a.

Although the first conductive type is the n-type and the second conductive type is the p-type in the description of the first to fourth embodiments of the present invention, the first conductive type may be the p-type and the second conductive type may be the n-type. The trench IGBT made of a silicon semiconductor is taken as an example in the description, the trench IGBTs may be made of a silicon carbide semiconductor.

What is claimed is:

1. A manufacturing method for a semiconductor device, the method comprising:
   providing a first-conductive-type silicon substrate having a first principal surface and a second principal surface opposite to the first principal surface;
   forming a second-conductive-type base region disposed on the first principal surface of the silicon substrate;
   selectively forming a first-conductive-type emitter region disposed in the base region from the first principal surface side, the emitter region being shallower than the base region;
   forming a first groove part, a plurality of second groove parts, and a plurality of third groove parts in stripes,
   wherein
   the first groove part is formed from the first principal surface side to the second principal surface side through the emitter region and the base region,
   the plurality of second groove parts are formed at both sides of the first groove part from the first principal surface side to the second principal surface side through the base region, and
   the plurality of third groove parts are formed at each side away from the emitter region and of the plurality of second groove parts from the first principal surface side to the second principal surface side through the base region, and are formed directly adjacent to each other;

forming gate insulating films covering inner walls of the first groove part, the second groove parts, and the third groove parts;

forming trench gates by filling the first groove part, the second groove parts, and the third groove parts with polysilicon over the gate insulating films;

forming gate electrodes electrically connected to the trench gates embedded in the first groove part and the trench gates embedded in the third groove parts; and forming emitter electrodes electrically connected to the trench gates embedded in the second groove parts.

2. The manufacturing method for a semiconductor device according to claim 1, further comprising:

forming a second-conductive-type contact region in the base region from the first principal surface side; wherein the emitter region is formed along the first groove part, and the contact region is formed adjacent to the emitter region at the side opposite to the first groove part.

3. The manufacturing method for a semiconductor device according to claim 1, further comprising:

forming a second-conductive-type contact region in the base region from the first principal surface side; wherein the contact region is formed adjacent to the emitter region, and the emitter region and the contact region are formed alternately repeatedly along the first groove part.

4. The manufacturing method for a semiconductor device according to claim 1, further comprising:

forming a contact region disposed in the base region between the third groove parts formed adjacent to each other from the first principal surface side.

5. The manufacturing method for a semiconductor device according to claim 1, wherein a distance between a second groove part and a third groove part is shorter than a distance between the second groove part and the first groove part.

6. The method according to claim 1, wherein the semiconductor device is an insulated gate bipolar junction transistor (IGBT).

7. A manufacturing method for a semiconductor device, the method comprising:

providing a first-conductive-type silicon substrate having a first principal surface and a second principal surface opposite to the first principal surface;

forming a first-conductive-type base region in the silicon substrate from the first principal surface side;

selectively forming a second-conductive-type base region in the first-conductive-type base region from the first principal surface side, selectively forming a first-conductive-type emitter region in the second-conductive-type base region from the first principal surface side, the emitter region being shallower than the second-conductive-type base region;

forming a first groove part, a plurality of second groove parts, and a plurality of third groove parts in stripes, wherein the first groove part is formed from the first principal surface to the second principal surface through the emitter region and the second-conductive-type base region, the plurality of second groove parts are formed at both sides of the first groove part from the first principal surface to the second principal surface and are in contact with the second-conductive-type base region, and the plurality of third groove parts are formed in the first-conductive-type base region at each side away from the second-conductive-type base region and of the plurality of second groove parts from the first principal surface to the second principal surface, and are formed directly adjacent to each other;

forming gate insulating films covering inner walls of the first groove part, the second groove parts, and the third groove parts;

forming trench gates by filling the first groove part, the second groove parts, and the third groove parts with polysilicon over the gate insulating films;

forming gate electrodes electrically connected to the trench gates embedded in the first groove part and the trench gates embedded in the third groove parts; and forming emitter electrodes electrically connected to the trench gates embedded in the second groove parts.

8. The manufacturing method for a semiconductor device according to claim 7, further comprising:

forming a second-conductive-type contact region in the second-conductive-type base region from the first principal surface side; wherein the emitter region is formed along the first groove part, and the contact region is formed adjacent to the emitter region at the side opposite to the first groove part.

9. The manufacturing method for a semiconductor device according to claim 7, further comprising:

forming a second-conductive-type contact region in the second-conductive-type base region from the first principal surface side; wherein the contact region is formed adjacent to the emitter region, and the emitter region and the contact region are formed alternately repeatedly along the first groove part.

10. The method according to claim 7, wherein the semiconductor device is an insulated gate bipolar junction transistor (IGBT).

* * * * *